United States Patent
Komiyama

(10) Patent No.: US 11,817,565 B2
(45) Date of Patent: Nov. 14, 2023

(54) BATTERY SYSTEM AND METHOD FOR DETERMINING ABNORMALITY OF BATTERY

(71) Applicant: Toyota Jidosha Kabushiki Kaisha, Toyota (JP)

(72) Inventor: Keita Komiyama, Okazaki (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 377 days.

(21) Appl. No.: 17/171,097

(22) Filed: Feb. 9, 2021

(65) Prior Publication Data
US 2021/0257680 A1  Aug. 19, 2021

(30) Foreign Application Priority Data
Feb. 17, 2020 (JP) ................ 2020-024187

(51) Int. Cl.
*H01M 10/48* (2006.01)
*H02J 7/00* (2006.01)

(52) U.S. Cl.
CPC ........ *H01M 10/482* (2013.01); *H02J 7/005* (2020.01); *H02J 7/0048* (2020.01); *H01M 2220/20* (2013.01)

(58) Field of Classification Search
None
See application file for complete search history.

(56) References Cited

U.S. PATENT DOCUMENTS

| 10,884,063 B2* | 1/2021 | Jeon ............... G01R 31/388 |
| 2003/0118900 A1 | 6/2003 | Otohata |
| 2019/0041468 A1* | 2/2019 | Katoh ............ G01R 31/382 |

FOREIGN PATENT DOCUMENTS

| JP | 2003-187762 A | 7/2003 |
| WO | 2019138286 A1 | 7/2019 |

* cited by examiner

*Primary Examiner* — Eli S Mekhlin
(74) *Attorney, Agent, or Firm* — Dinsmore & Shohl LLP

(57) ABSTRACT

A battery system, capable of detecting a pore generated in an outer package film in an early stage, includes: a battery including a plurality of laminated cells arranged along a thickness direction and connected in series, and a plate arranged between a pair of the laminated cells; a first voltage sensor configured to measure a first voltage between a terminal of a reference cell belonging to the plurality of laminated cells, and the plate; a second voltage sensor configured to measure a second voltage between a terminal of the reference cell, and among the pair of laminated cells facing the plate, the laminated cell in the reference cell side; and an electronic control unit including a first obtaining unit configured to obtain the first voltage from the first voltage sensor.

6 Claims, 6 Drawing Sheets

BATTERY SYSTEM AND METHOD FOR DETERMINING ABNORMALITY OF BATTERY

CROSS REFERENCE TO RELATED APPLICATIONS

This nonprovisional application claims priority to Japanese Patent Application No. 2020-024187 filed on Feb. 17, 2020, with the Japan Patent Office, which is incorporated herein by reference in its entirety.

TECHNICAL FIELD

The present disclosure relates to a battery system and a method for determining an abnormality of a battery.

BACKGROUND ART

A laminated cell is a cell in which a power generating element is sealed with an outer package film, and the use of the outer package film facilitates thinning and space saving of a battery. For example, Japanese Patent Application Laid-Open (JP-A) No. 2003-187762 discloses a non-aqueous electrolyte battery in which a battery element including a cathode, an anode, and an electrolyte, are stored in a laminated outer package, and a moisture absorbing member is arranged distanced from the battery element. In addition, Japanese Patent Application Laid-Open (JP-A) No. 2003-187762 discloses about reducing permeation of moisture into the outer package by doubling a moisture absorbing agent arranged around a sealing part.

Also, as an abnormality detecting device of secondary battery, a device utilizing a voltage value and a current value of the secondary battery has been known. For example, International Publication No. WO 2019/138286 discloses an abnormality detecting device of secondary battery including a first detecting measure configured to detect a voltage value of secondary battery which is a first observation value, a second detecting measure configured to detect a current value of secondary battery which is a second observation value, calculation unit configured to calculate a presumed voltage value using a regression model, and a determination unit configured to obtain a different between the voltage value of the first observation value and the presumed voltage value obtained previously, and to determine an abnormality of the secondary battery when the value exceeds a specified threshold value range.

SUMMARY OF DISCLOSURE

Technical Problem

Since an outer package film is thin, for example, a pore may be generated due to a foreign substance mixed during the production of a cell. The present disclosure has been made in view of the above circumstances, and a main object thereof is to provide a battery system capable of detecting a pore generated in an outer package film in an early stage.

Solution to Problem

In order to achieve the object, the present disclosure provides a battery system comprising: a battery including a plurality of laminated cells arranged along a thickness direction and connected in series, and a plate arranged between a pair of the laminated cells; a first voltage sensor configured to measure a first voltage that is a voltage between a terminal of a reference cell belonging to the plurality of laminated cells, and the plate; a second voltage sensor configured to measure a second voltage that is a voltage between a terminal of the reference cell and, among the pair of laminated cells facing the plate, the laminated cell in the reference cell side; and a determination device; and the determination device includes: a first obtaining unit configured to obtain the first voltage from the first voltage sensor, a second obtaining unit configured to obtain the second voltage from the second voltage sensor, and a first determining unit configured to determine an abnormality based on the first voltage and the second voltage.

According to the present disclosure, the determination device determines an abnormality based on the first voltage and the second voltage so as to allow a battery system to detect a pore generated in an outer package film in an early stage.

In the disclosure, the battery system may further comprise a third voltage sensor configured to measure a third voltage that is a voltage between a terminal of the reference cell and, among the pair of laminated cells facing the plate, the laminated cell in the opposite side of the reference cell, and the determination device further includes: a third obtaining unit configured to obtain the third voltage from the third voltage sensor, and a second determining unit configured to determine an abnormality based on the first voltage and the third voltage when the first determining unit determines an abnormality.

The present disclosure also provides a battery system comprising: a battery including a plurality of laminated cells arranged along a thickness direction and connected in series, and a plate arranged between a pair of the laminated cells, a first voltage sensor configured to measure a first voltage that is a voltage between a terminal of a reference cell belonging to the plurality of laminated cells, and the plate, a third voltage sensor configured to measure a third voltage that is a voltage between a terminal of the reference cell and, among the pair of laminated cells facing the plate, the laminated cell in the opposite side of the reference cell, and a determination device; and the determination device includes: a first obtaining unit configured to obtain the first voltage from the first voltage sensor, a third obtaining unit configured to obtain the third voltage from the third voltage sensor, and a second determining unit configured to determine an abnormality based on the first voltage and the third voltage.

According to the present disclosure, the determination device determines an abnormality based on the first voltage and the third voltage so as to allow a battery system to detect a pore generated in an outer package film in an early stage.

In the disclosure, the battery may include a plurality of the plate, and the first voltage sensor may select the plate for measuring the first voltage from the plurality of the plate.

The present disclosure also provides a method for determining an abnormality of a battery including a plurality of laminated cells arranged along a thickness direction and connected in series, and a plate arranged between a pair of the laminated cells, the method comprising: a first voltage measuring step of measuring a first voltage that is a voltage between a terminal of a reference cell belonging to the plurality of the laminated cell, and the plate; a second voltage measuring step of measuring a second voltage that is a voltage between a terminal of the reference cell and, among the pair of laminated cells facing the plate, the laminated cell in the reference cell side; and a first determining step of determining an abnormality based on the first voltage and the second voltage.

According to the present disclosure, an abnormality is determined based on the first voltage and the second voltage, and thus a pore generated in the outer package film can be detected in an early stage.

The present disclosure also provides a method for determining an abnormality of a battery including a plurality of laminated cells arranged along a thickness direction and connected in series, and a plate arranged between a pair of the laminated cells, the method comprising: a first voltage measuring step of measuring a first voltage that is a voltage between a terminal of a reference cell belonging to the plurality of the laminated cell, and the plate; a third voltage measuring step of measuring a third voltage that is a voltage between a terminal of the reference cell and, among the pair of laminated cells facing the plate, the laminated cell in the opposite side of the reference cell; and a second determining step of determining an abnormality based on the first voltage and the third voltage.

According to the present disclosure, an abnormality is determined based on the first voltage and the third voltage, and thus a pore generated in the outer package film can be detected in an early stage.

Effects of Disclosure

A battery system of the present disclosure is capable of detecting a pore generated in an outer package film in an early stage.

DESCRIPTION OF EMBODIMENTS

The battery system and the method for determining an abnormality of a battery in the present disclosure are hereinafter explained in details.

A. Battery System

Figure 1:
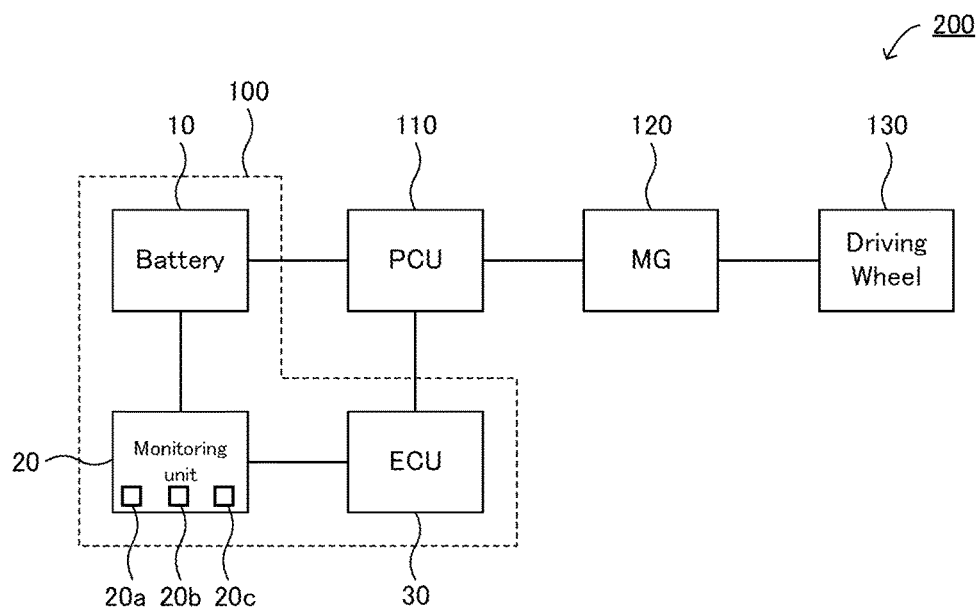
FIG. 1 is a diagram schematically exemplifying a whole constitution of a vehicle provided with the battery system of the present disclosure.

FIG. 1 is a diagram schematically exemplifying a whole constitution of a vehicle provided with the battery system of the present disclosure. Vehicle 200 comprises battery system 100, Power Control Unit (PCU) 110, Motor Generator (MG) 120, and driving wheel 130. The battery system 100 comprises battery 10, monitoring unit 20, and Electronic Control Unit (ECU) 30.

The monitoring unit 20 includes at least a first voltage sensor 20a, a second voltage sensor 20b, and a third voltage sensor 20c. In addition, the ECU 30 conducts various electric control of the vehicle 200, and corresponds to a determination device. The ECU 30 (determination device) includes at least first obtaining unit, a second obtaining unit, a third obtaining unit, a first determining unit, a second determining unit, and a third determining unit as processing blocks to achieve its function, and determines an abnormality based on a first voltage and, at least one of a second voltage and a third voltage.

According to the present disclosure, the determination device determines an abnormality based on the first voltage and, at least one of the second voltage and the third voltage, so as to allow the battery system to detect a pore generated in an outer package film in an early stage. Here, as described above, since the outer package film is thin, for example, a pore may be generated in the outer package film due to a foreign substance mixed during the production of cells.

When a pore is generated, moisture permeates into the cell, and it may cause deterioration of the power generating element. Gas may be also generated from the deteriorated power generating element. Further, when moisture permeates into the cell, reactions proceed in the order of deterioration of the power generating element due to the permeated moisture, and then generation of gas due to the deteriorated power generating element; thus, there is a time lag from the generation of a pore until the generation of gas. From the above described reasons, when generation of gas from the laminated cell is detected with some kind of means from outside (such as with gas sensor), the deterioration of power generating element has already proceeded in many cases.

To this, in the present disclosure, the determination device determines an abnormality based on the first voltage and, at least one of the second voltage and the third voltage, and thus the abnormality can be detected immediately after the pore is generated (before the deterioration of power generating element proceeds).

In addition, timings when a pore is generated in the outer package film due to a foreign substance may be presumably the followings: during production of the cell, during production of the battery, and after the production of the battery. On the other hand, after the production of the battery, it is presumed that the cell expands and contracts due to charge and discharge, and over time, the foreign substance go through the outer package film to generate a pore.

Further, particularly when the laminated cell is an all solid state battery, it is required to apply strong restraining pressure to the laminated cell in order to obtain excellent battery properties. For example, necessity of applying strong restraining pressure to the laminated cell is low in a liquid-based battery using a liquid electrolyte since the liquid electrolyte has fluidity. In contrast, in an all solid state battery using solid electrolytes such as an inorganic solid electrolyte, since the solid electrolyte does not have fluidity, it is required to apply strong restraining pressure to the laminated cell in order to bring the solid electrolytes into contact well with each other. As a result, for example, even a minute foreign substance that does not cause problems in the liquid-based battery may be a cause of generating a pore in the outer package film when it comes to the all solid state battery. For this reason, the problem of generation of a pore due to a foreign substance may easily occur when the laminated cell is an all solid state battery.

Also, for example, Japanese Patent Application Laid-Open (JP-A) No. 2003-187762 discloses about reducing permeation of moisture into the outer package by doubling a moisture absorbing agent arranged around a sealing part. However, for example, a part where the foreign substance mixed during production of the cell generates a pore is not in the sealing part of the outer package film, but is often in a plane part (main surface part). In the present disclosure, the determination device determines an abnormality based on the first voltage and, at least one of the second voltage and the third voltage, and thus the abnormality can be detected quickly.

1. Battery

The battery system in the present disclosure comprises a battery. The battery includes a plurality of laminated cells arranged along a thickness direction and connected in series, and a plate arranged between a pair of the laminated cells. In addition, the battery 10 is charged by receiving the power generated by MG 120 via PCU 110 when MG 120 generates power.

Figure 2:
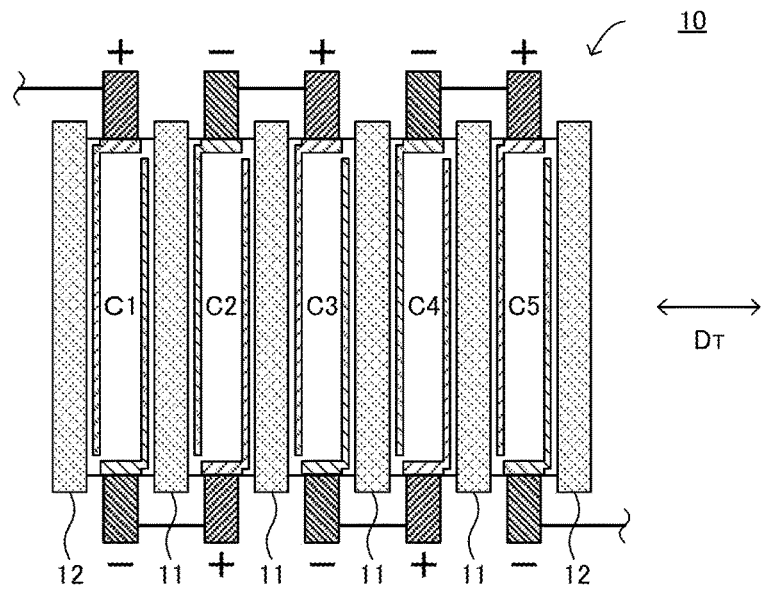
FIG. 2 is a schematic cross-sectional view exemplifying the all in the present disclosure.

FIG. 2 is a schematic cross-sectional view exemplifying the battery in the present disclosure. Battery 10 shown in FIG. 2 includes a plurality of laminated cells C1 to C5. The plurality of laminated cells C1 to C5 are arranged along thickness direction DT so that plane parts (main surface parts) face to each other. Further, the plurality of laminated cells C1 to C5 are connected in series.

Battery 10 shown in FIG. 2 also includes plate 11 arranged between a pair of the laminated cells, and end plate 12. The plate is usually conductive, and typically a metal plate. Also, the plate may be, for example, a cool plate to cool the laminated cells.

Battery 10 may include just one of plate 11, but preferably include a plurality thereof. The reason therefor is to improve accuracy of determining an abnormality. For example, in FIG. 2, plate 11 is arranged respectively between C1 and C2, between C2 and C3, between C3 and C4, and between C4 and C5. The number of the plate may be 1, may be 2 or more, and may be 5 or more. Incidentally, although not illustrated in particular, the battery in the present disclosure may include a case configured to store the laminated cells and the plate.

Figure 3:
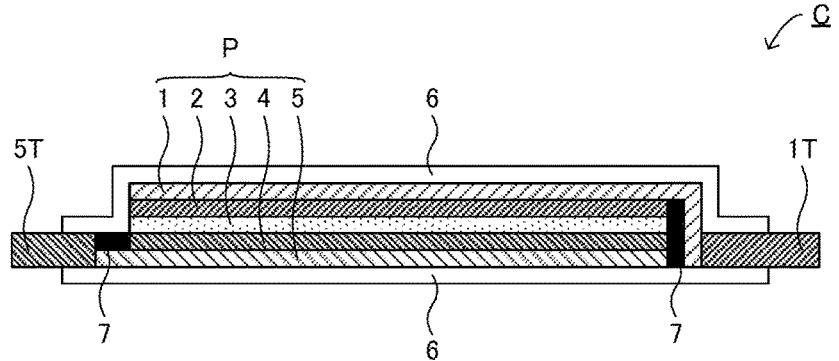
FIG. 3 is a schematic cross-sectional view exemplifying the laminated cell in the present disclosure.

FIG. 3 is a schematic cross-sectional view exemplifying one the laminated cells in the present disclosure. Laminated cell C shown in FIG. 3 includes: power generating element P in which cathode current collector 1, cathode layer 2, electrolyte layer 3, anode layer 4, and anode current collector 5 are arranged in a thickness direction in this order; outer package film 6 configured to store the power generating element P; and insulating part 7 stored in the outer package film 6 and configured to prevent short circuit. The cathode current collector 1 is connected to cathode terminal 1T, and the anode current collector 5 is connected to anode terminal 5T. The kind of the laminated cell C is not particularly limited, and may be a lithium ion secondary battery.

The electrolyte layer may contain a solid electrolyte or an electrolyte solution (liquid electrolyte). Incidentally, the all solid state battery refers to a battery of which electrolyte layer is a solid electrolyte layer. Examples of the solid electrolyte may include an inorganic solid electrolyte such as an oxide solid electrolyte and a sulfide solid electrolyte. In addition, the restraining pressure of the all solid state battery is, for example, 0.1 MPa or more, and may be 1 MPa or more.

Further, the outer package film typically includes, from the power generating element side, a heat seal layer, a metal layer, and a resin layer. Examples of the material of the heal seal layer may include an olefin-based resin such as polypropylene (PP) and polyethylene (PE). Examples of the material of the metal layer may include aluminum, an aluminum alloy, and stainless steel. Examples of the material of the resin layer may include polyethylene terephthalate (PET) and nylon. The thickness of the outer package film is, for example, 50 µm or more and 200 µm or less.

2. Voltage Sensor

The battery system in the present disclosure comprises the first voltage sensor 20*a* and, at least one of the second voltage sensor 20*b* and the third voltage sensor 20*c*. For example, in FIG. 1, monitoring unit 20 monitors the condition of battery 10 and outputs a monitoring result to ECU 30. The monitoring unit 20 includes at least the first voltage sensor 20*a*, the second voltage sensor 20*b*, and the third voltage sensor 20*c*, and may include current sensor and a temperature sensor as required.

The first voltage sensor 20*a* measures a first voltage that is a voltage between a terminal of a reference cell belonging to the plurality of laminated cells, and the plate. For example, in FIG. 4, laminated cell C1 corresponds to the reference cell, and a voltage between terminal T of C1 and plate 11 corresponds to the first voltage.

As the reference cell, an arbitrary cell belonging to the plurality of the laminated cells may be selected. The reference cell may be, for example, among the plurality of the laminated cells, a cell positioned at the outermost, and may be a cell not positioned at the outermost (positioned at inner side). In addition, the terminal of the reference cell may be a cathode terminal, and may be an anode terminal. Further, the reference cell may be one of the pair of the laminated cells facing the plate, and may not be the pair of the laminated cells facing the plate.

Also, the first voltage sensor 20*a* may select the plate for measuring the first voltage from the plurality of the plate. For example, in FIG. 4, by controlling ON/OFF of switches SW1 to SW4, the plate for measuring the first voltage can be selected from the plurality of the plate. In this manner, the battery system in the present disclosure may comprise a switching device configured to select the plate.

The battery system in the present disclosure may comprise the second voltage sensor 20*b* configured to measure a second voltage that is a voltage between a terminal of the reference cell and, among the pair of laminated cells facing the plate (plate for measuring the first voltage), the laminated cell in the reference cell side. Incidentally, "among the pair of laminated cells facing the plate, the laminated cell in the reference cell side" refers to, among the pair of the laminated cells facing the plate, the laminated cell having a small voltage with respect to the reference cell.

The battery system of the present disclosure may further comprise the third voltage sensor 20*c* configured to measure a third voltage that is a voltage between a terminal of the reference cell and, among the pair of laminated cells facing the plate (plate for measuring the first voltage), the laminated cell in the opposite side of the reference cell. Incidentally, "among the pair of laminated cells facing the plate, the laminated cell in the opposite side of the reference cell" refers to, among the pair of the laminated cells facing the plate, the laminated cell having a large voltage with respect to the reference cell. In some embodiments, the second voltage sensor 20*b* and the third voltage sensor 20*c* may be a common voltage sensor such that the second voltage sensor 20*b* is, for example, configured to measure the voltage of each laminated cell, and the determination device may include a calculation unit configured to calculate at least one of the second voltage and the third voltage based on the measurement path of the first voltage.

3. Determination Device

(1) Constitution of Determination Device

The battery system in the present disclosure comprises a determination device. The determination device is configured to detect a pore in the outer package film due to a foreign substance. For example, in FIG. 1, ECU 30 includes a CPU (Central Processing Unit), a memory, and an input and output port configured to input and output various signals. Examples of the memory includes a ROM (Read Only Memory), a RAM (Random Access Memory), and a rewritable nonvolatile memory. The CPU processes programs recorded in the memory to conduct various controls. Various controls conducted by ECU can also be processed by a dedicated hardware (electronic circuit), but not limited to software.

The determination device includes at least an obtaining unit and a determining unit as processing blocks to achieve its function.

Figure 4:
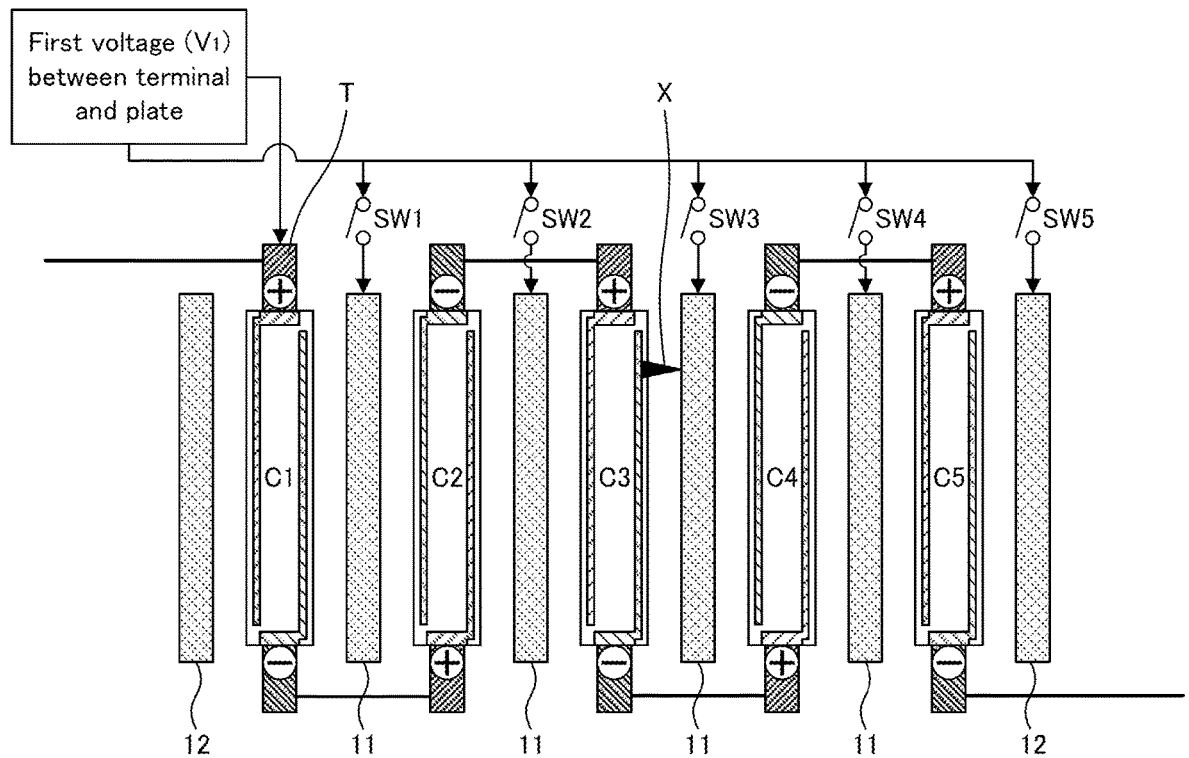
FIG. 4 is a diagram explaining the battery system in the present disclosure.

The first obtaining unit is configured to obtain a first voltage from the first voltage sensor 20a. For example, as shown in FIG. 4, when foreign substance X is present in the right side of laminated cell C3, the voltage 1 is generated by turning on the switch SW3 connected to plate 11 arranged between the laminated cell C3 and laminated cell C4. The first voltage ($V_1$) is usually equal to the total of the voltages ($V_{C1}+V_{C2}+V_{C3}$) of the laminated cells C1 to C3. In other words, the voltage ($V_{C1}+V_{C2}+V_{C3}$) is generated as a voltage between the terminal T of the laminated cell C1 that is a reference cell and, the plate 11. Incidentally, the foreign substance X is typically a conductive foreign substance.

Figure 5:
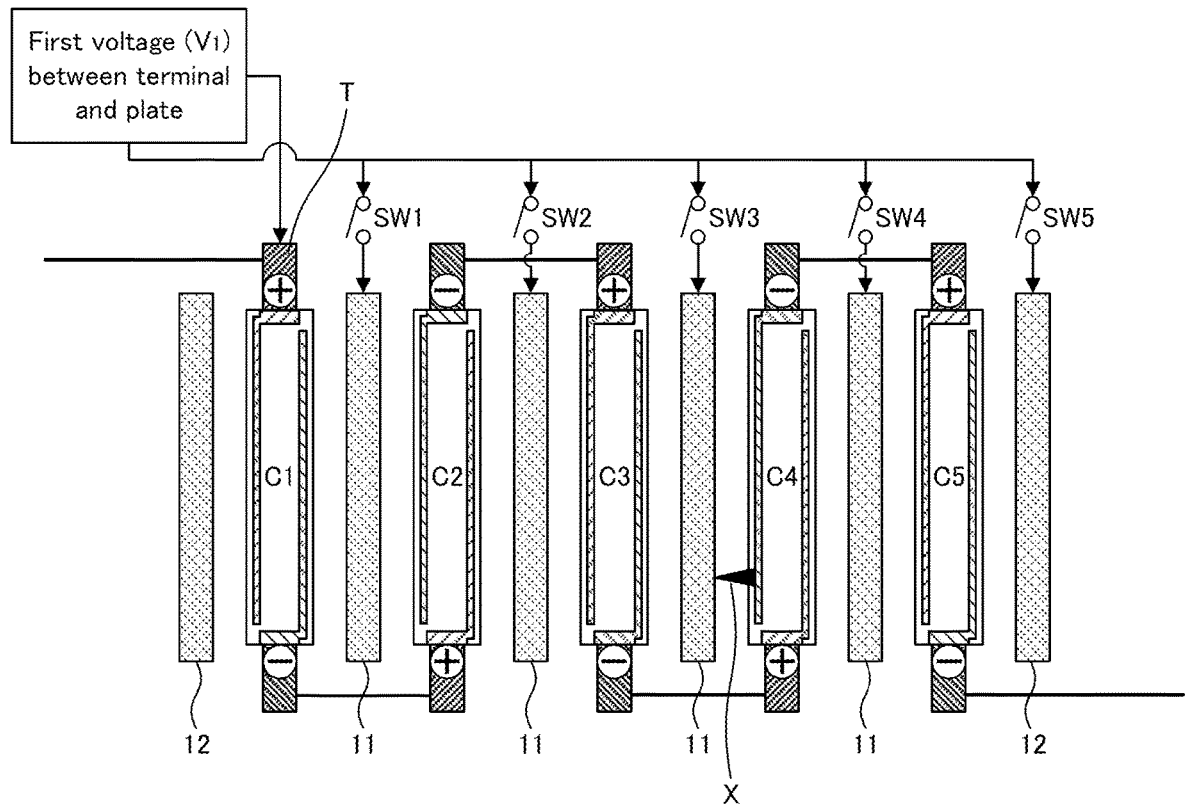
FIG. 5 is a diagram explaining the battery system in the present disclosure.

In addition, as shown in FIG. 5, when foreign substance X is present in the left side of the laminated cell C4, the first voltage is generated by turning on the switch SW3 connected to the plate 11 arranged between the laminated cell C3 and the laminated cell C4. The first voltage ($V_1$) is usually equal to the total of the voltages ($V_{C1}+V_{C2}+V_{C3}+V_{C4}$) of the laminated cells C1 to C4.

Figure 6:
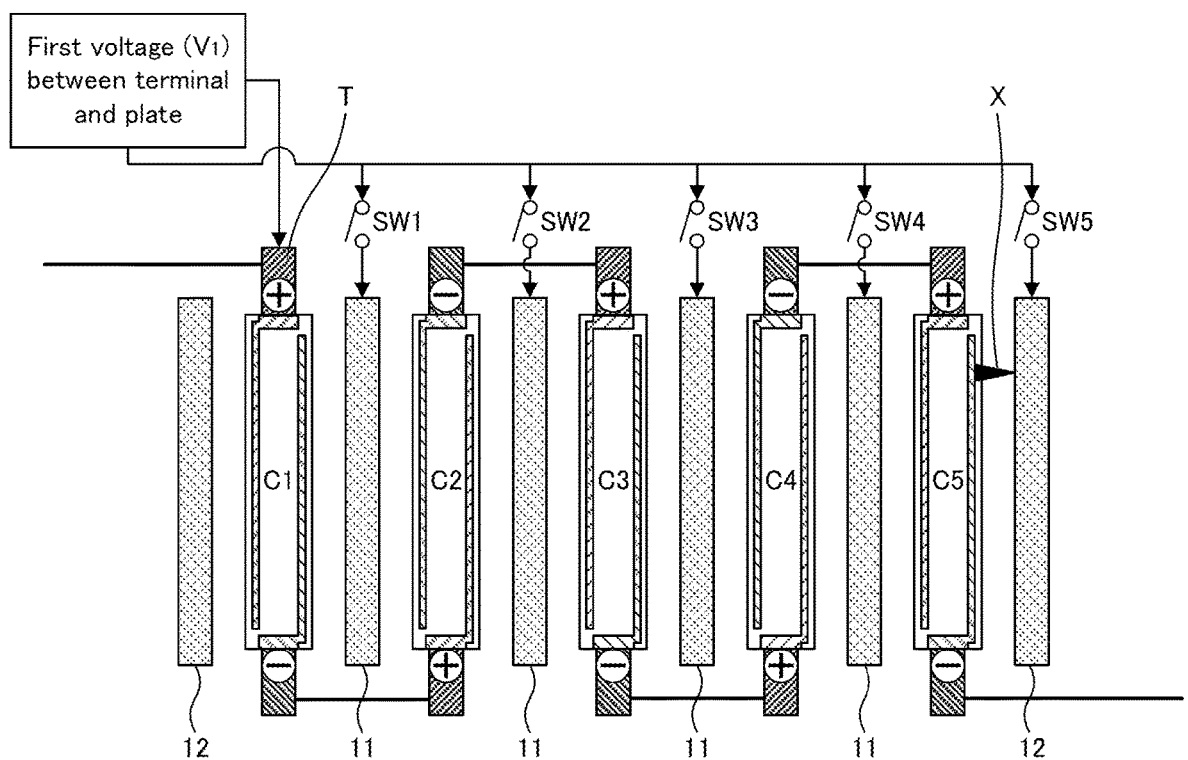
FIG. 6 is a diagram explaining the battery system in the present disclosure.

Further, as shown in FIG. 6, when foreign substance X is present in the right side of laminated cell C5, the first voltage is generated by turning on the switch SW5 connected to end plate 12 arranged on one surface side of the laminated cell C5. The first voltage ($V_1$) is usually equal to the total of the voltages ($V_{C1}+V_{C2}+V_{C3}+V_{C4}+V_{C5}$) of the laminated cells C1 to C5. In this manner, in the present disclosure, the first voltage may be calculated from the voltage between the terminal of the reference cell and the end plate.

The determination device in the present disclosure may include a second obtaining unit configured to obtain a second voltage from the second voltage sensor 20b, and first determination unit configured to determine an abnormality based on the first voltage and the second voltage. For example, as shown in FIG. 4, when foreign substance X is present in the right side of the laminated cell C3, obtained is second voltage ($V_2$) that is a voltage between terminal T of the laminated cell C1 which is a reference cell and, the laminated cell C3 in the reference cell (laminated cell C1) side, among a pair of laminated cells C3 and C4 facing corresponding plate 11. In this case, the second voltage ($V_2$) is equal to the total of the voltages ($V_{C1}+V_{C2}+V_{C3}$) of laminated cells C1 to C3. The first determining unit determines an abnormality when $V_1$ is equal to $V_2$.

In addition, as shown in FIG. 5, when foreign substance X is present in the left side of the laminated cell C4, obtained is second voltage ($V_2$) that is a voltage between terminal T of the laminated cell C1 which is a reference cell and, the laminated cell C3 in the reference cell (laminated cell C1) side, among a pair of laminated cells C3 and C4 facing corresponding plate 11. In this case, the second voltage ($V_2$) is equal to the total of the voltages ($V_{C1}+V_{C2}+V_{C3}$) of laminated cells C1 to C3. As described above, the first voltage ($V_1$) in FIG. 5 is usually equal to the total of the voltages ($V_{C1}+V_{C2}+V_{C3}+V_{C4}$) of the laminated cells C1 to C4; thus, $V_1$ is larger than $V_2$. The first determining unit determines an abnormality when $V_1$ is larger than $V_2$.

The first determining unit is configured to determine an abnormality based on the first voltage and the second voltage. As described above, the first determining unit determines an abnormality when $V_1$ is equal to $V_2$, or when $V_1$ is larger than $V_2$. The case "$V_1$ is equal to $V_2$" includes when, for example, $0.9 \leq V_1/V_2 \leq 1.05$ is satisfied, in consideration of the resistance of the plate and an error of the voltage sensor. In particular, when $V_1$ is in a range of $V_2 \pm 2.5\%$, it can be said that the possibility a pore has been generated in the outer package film is extremely high. Meanwhile, the case "$V_1$ is larger than $V_2$" is usually $1 < V_1/V_2$, and it may be $1.5 \leq V_1/V_2$.

The determination device in the present disclosure may include a third obtaining unit configured to obtain a third voltage from the third voltage sensor 20c, and a second determining unit configured to determine an abnormality based on the first voltage and the third voltage when the first determining unit determines an abnormality. As shown in FIG. 5, when foreign substance X is present in the left side of the laminated cell C4, obtained is a third voltage ($V_3$) that is a voltage between terminal T of the laminated cell C1 which is a reference cell and, laminated cell C4 in the opposite side of the reference cell (laminated cell C1), among a pair of the laminated cells C3 and C4 facing corresponding plate 11. In this case, the voltage ($V_3$) is equal to the total of the voltages ($V_{C1}+V_{C2}+V_{C3}+V_{C4}$) of the laminated cells C1 to C4.

As described above, the first voltage ($V_1$) in FIG. 5 is usually equal to the total of the voltages ($V_{C1}+V_{C2}+V_{C3}+V_{C4}$) of the laminated cells C1 to C4; thus, $V_1$ is equal to $V_3$. The second determining unit determines an abnormality when $V_1$ is equal to $V_3$. The case "$V_1$ is equal to $V_3$" includes when, for example, $0.9 \leq V_1/V_3 \leq 1.05$ is satisfied, in consideration of the resistance of the plate and an error of the voltage sensor. In particular, when $V_1$ is in a range of $V_3 \pm 2.5\%$, it can be said that the possibility a pore has been generated in the outer package film is extremely high. In the present disclosure, the second determining unit may determine an abnormality based on the first voltage and the third voltage when the first determining unit determines an abnormality.

Further, the determination device may include a specifying unit configured to specify an abnormal laminated cell based on the first voltage, when the first determining unit or the second determining unit determines an abnormality. In that case, the battery system may comprise a display unit configured to notify to change the abnormal laminated cell specified by the specifying unit or to change the battery including the abnormal laminated cell. The display unit is, for example, a liquid crystal display.

(2) Procedures of Determination Device

Figure 7:
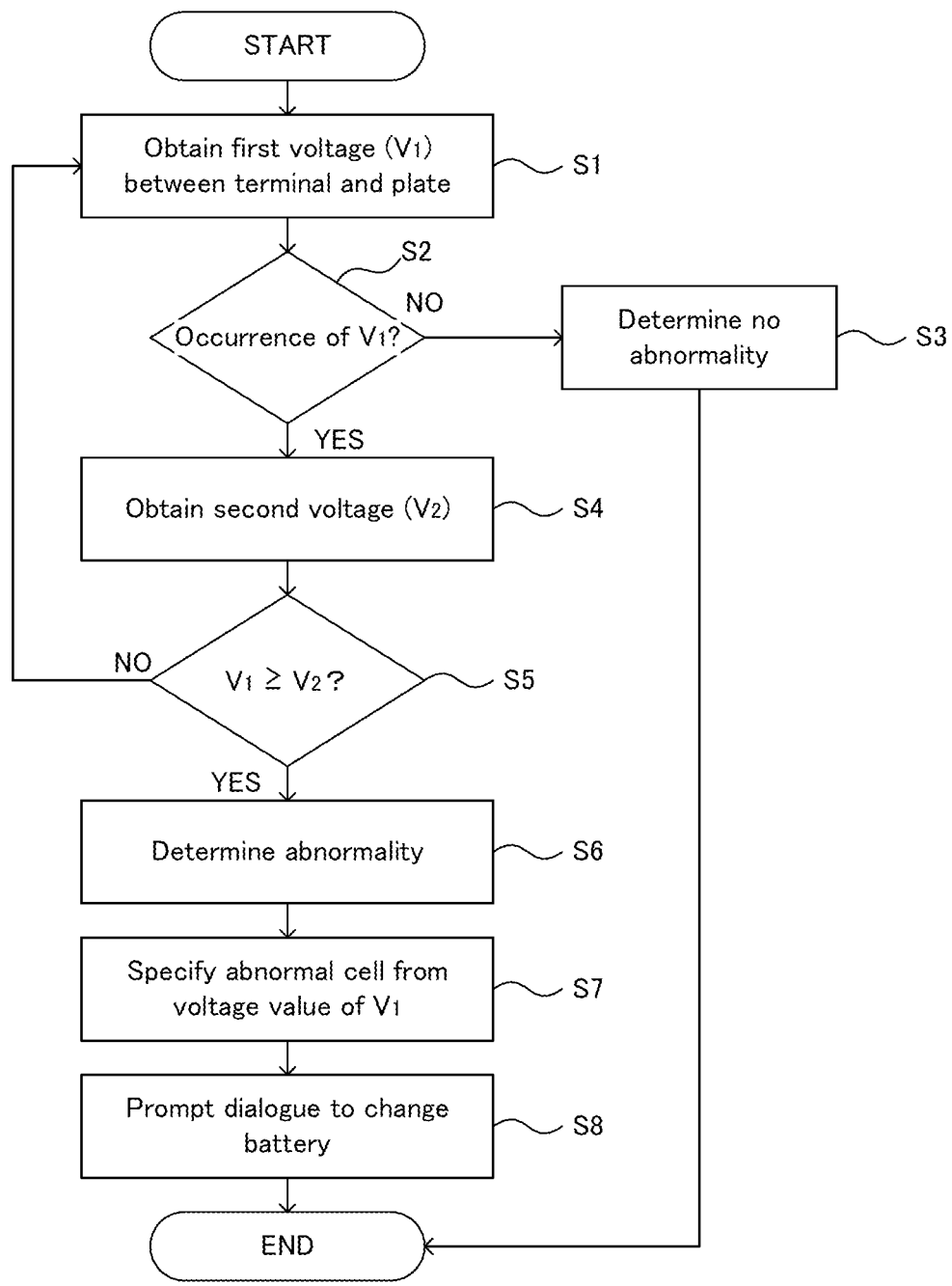
FIG. 7 is a flow chart exemplifying the procedures of the determination device in the present disclosure.

FIG. 7 is a flow chart exemplifying the procedures of the determination device in the present disclosure. As shown in FIG. 7, in step S1, obtained from the first voltage sensor 20a is first voltage ($V_1$) that is a voltage between a terminal of the reference cell belonging to the plurality of the laminated cells and, the plate. In step S2, whether the first voltage ($V_1$) is generated or not is determined. For example, as shown in FIG. 4, when foreign substance X is present in the right side of the laminated cell C3, the first voltage ($V_1$) would not be generated by turning on the switch SW2. In that case, the procedure goes to step S3: determine no abnormality, and it is the end of the process.

On the other hand, for example, as shown in FIG. 4, when foreign substance X is present in the right side of the laminated cell C3, the first voltage ($V_1$) is generated by turning on the switch SW3. In that case, the procedure goes to step S4. In the step S4, obtained from the second voltage sensor 20b is a second voltage ($V_2$) that is a voltage between the terminal of the reference cell and, among the pair of the laminated cells facing the plate, the laminated cell in the reference side cell.

In step S5, whether the first voltage ($V_1$) and the second voltage ($V_2$) satisfy $V_1 \geq V_2$ or not is determined. When $V_1 \geq V_2$ is not satisfied, the procedure goes back to the step S1. After that, the steps S1 to S5 may be repeated until $V_1 \geq V_2$ is satisfied, and the procedure may go to step S6 when the specified repeating number exceeds. On the other hand, when $V_1 \geq V_2$ is satisfied, the procedure goes to the step S6: determine abnormality. In step S7, an abnormal laminated cell is specified based on the first voltage ($V_1$), and in step S8, notification to change the specified abnormal laminated cell or to change the battery including the abnormal laminated cell is prompted, and it is the end of the process.

Figure 8:
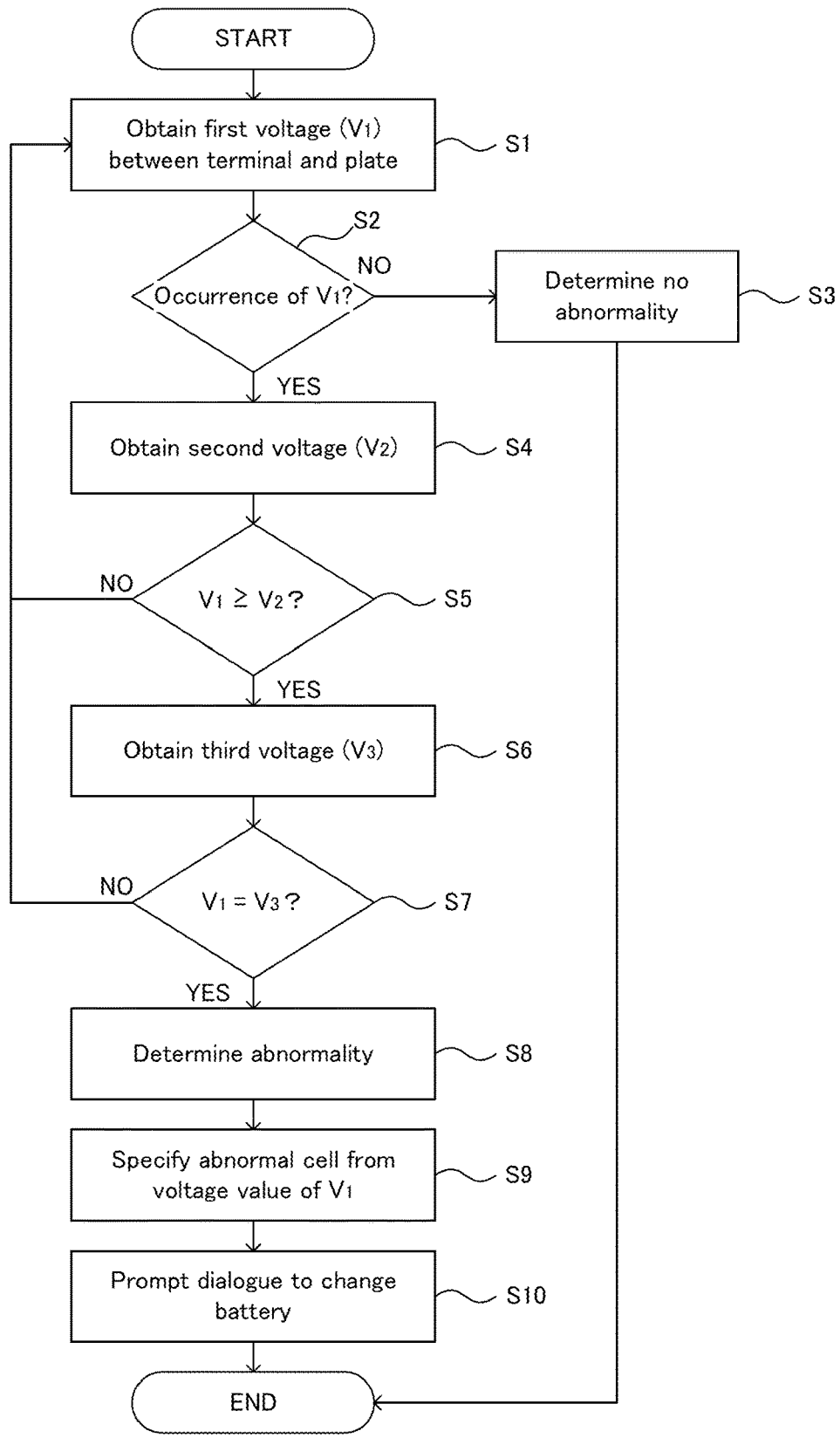
FIG. 8 is a flow chart exemplifying the procedures of the determination device in the present disclosure.

FIG. 8 is a flow chart exemplifying the procedures of the determination device in the present disclosure. Steps S1 to S5 in FIG. 8 are the same as the steps S1 to S5 in FIG. 7. In step S6, obtained from the third voltage sensor 20c is a third voltage ($V_3$) that is a voltage between the terminal of the reference cell and, among the pair of the laminated cells facing the plate, the laminated cell in the opposite side of the reference cell.

In step S7, whether the first voltage ($V_1$) and the third voltage ($V_3$) satisfy $V_1 = V_3$ or not is determined. When $V_1 = V_3$ is not satisfied, the procedure goes back to the step S1. After that, the steps S1 to S7 may be repeated until $V_1 = V_3$ is satisfied, and the procedure may go to step S8 when the specified repeating number exceeds. On the other hand, when $V_1 = V_3$ is satisfied, the procedure goes to step S8: determine abnormality. In step S9, an abnormal laminated cell is specified based on the first voltage ($V_1$), and in step S10, notification to change the specified abnormal laminated cell or to change the battery including the abnormal laminated cell is prompted, and it is the end of the process.

Figure 9:
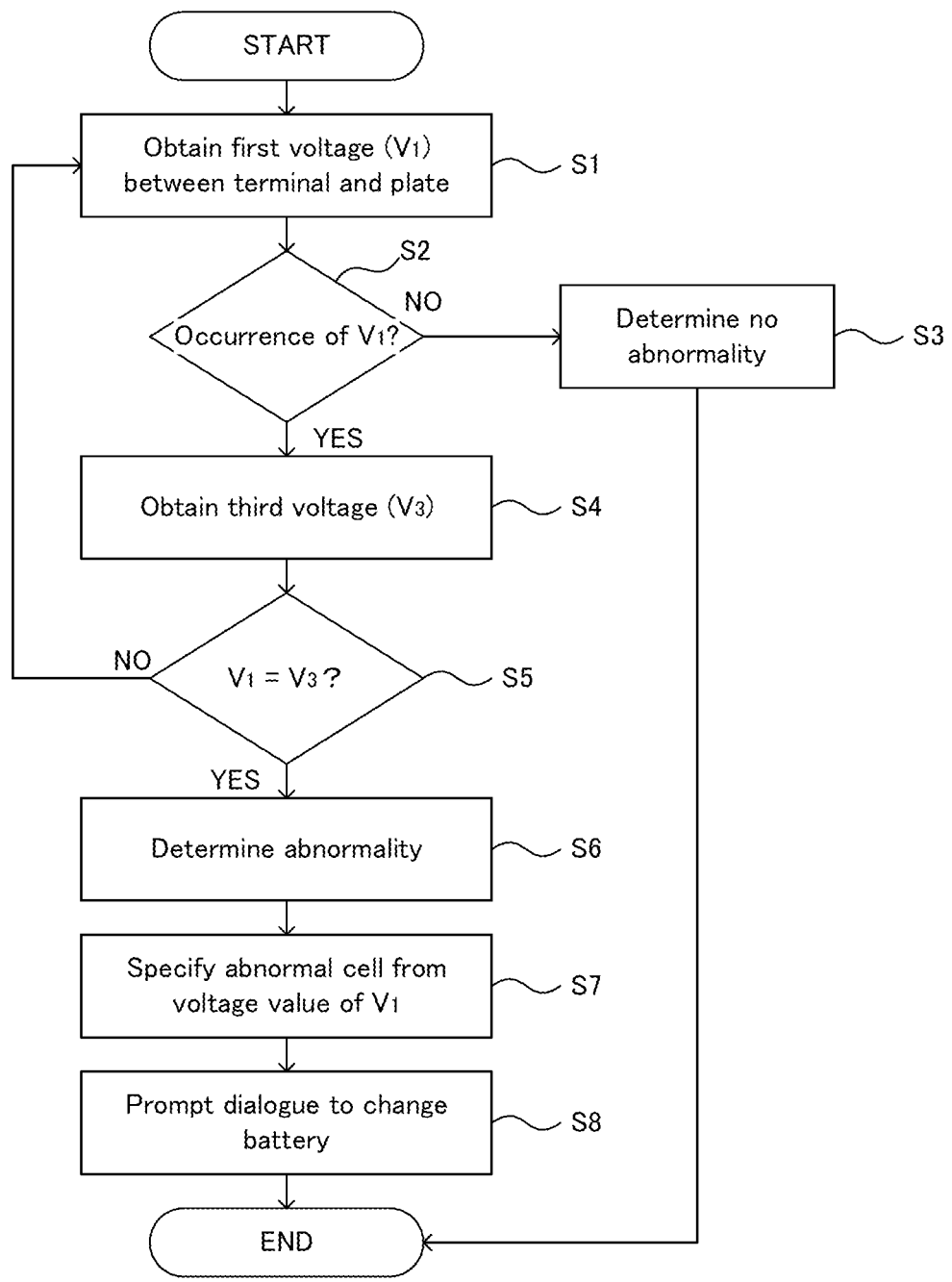
FIG. 9 is a flow chart exemplifying the procedures of the determination device in the present disclosure.

FIG. 9 is a flow chart exemplifying the procedures of the determination device in the present disclosure. Steps S1 to S3 in FIG. 9 are the same as the steps S1 to S3 in FIG. 7. In step S4, obtained from the third voltage sensor 20c is a third voltage ($V_3$) that is a voltage between the terminal of the reference cell and, among the pair of the laminated cells facing the plate, the laminated cell in the opposite side of the reference cell.

In step S5, whether the first voltage ($V_1$) and the third voltage ($V_3$) satisfy $V_1 = V_3$ or not is determined. When $V_1 = V_3$ is not satisfied, the procedure goes back to the step S1. After that, the steps S1 to S5 may be repeated until $V_1 = V_3$ is satisfied, and the procedure may go to step S6 when the specified repeating number exceeds. On the other hand, when $V_1 = V_3$ is satisfied, the procedure goes to step S6: determine abnormality. In step S7, an abnormal laminated cell is specified based on the first voltage ($V_1$), and in step S8, notification to change the specified abnormal laminated cell or to change the battery including the abnormal laminated cell is prompted, and it is the end of the process.

In some embodiments, the determination device repeats the procedures at a specified interval. Further, the determination device may repeat the procedures with a fixed reference cell, or with a different reference cell in each time. Similarly, the determination device may repeat the procedures with a fixed plate for measuring the second voltage, or a different plate for measuring the second voltage in each time.

B. Method for Determining Abnormality of Battery

A first embodiment of the method for determining an abnormality of a battery is a method for determining an abnormality of a battery including a plurality of laminated cells arranged along a thickness direction and connected in series, and a plate arranged between a pair of the laminated cells, the method comprising: a first voltage measuring step of measuring a first voltage that is a voltage between a terminal of a reference cell belonging to the plurality of the laminated cell, and the plate, a second voltage measuring step of measuring a second voltage that is a voltage between a terminal of the reference cell and, among the pair of laminated cells facing the plate, the laminated cell in the reference cell side, and a first determining step of determining an abnormality based on the first voltage and the second voltage.

According to the first embodiment, an abnormality is determined based on the first voltage and the second voltage, and thus a pore generated in the outer package film can be detected in an early stage.

The method for determining an abnormality of the battery may include a third voltage measuring step of measuring a third voltage that is a voltage between a terminal of the reference cell and, among the pair of laminated cells facing the plate, the laminated cell in the opposite side of the reference cell. Further, the method for determining an abnormality of the battery may include a second determining step of determining an abnormality based on the first voltage and the third voltage when an abnormality is determined in the first determining step.

The method for determining an abnormality of a battery in the second embodiment is a method for determining an abnormality of a battery including a plurality of laminated cells arranged along a thickness direction and connected in series, and a plate arranged between a pair of the laminated cells, the method comprising: a first voltage measuring step of measuring a first voltage that is a voltage between a terminal of a reference cell belonging to the plurality of the laminated cell, and the plate, a third voltage measuring step of measuring a third voltage that is a voltage between a terminal of the reference cell and, among the pair of laminated cells facing the plate, the laminated cell in the opposite side of the reference cell, and a second determining step of determining an abnormality based on the first voltage and the third voltage.

According to the second embodiment, an abnormality is determined based on the first voltage and the third voltage, and thus a pore generated in the outer package film can be detected in an early stage.

Incidentally, each step in the method for determining an abnormality of the battery are in the same contents as those described in "A. Battery system" above; thus, the descriptions herein are omitted.

The present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

REFERENCE SIGNS LIST 1 cathode current collector
2 cathode layer
3 electrolyte layer
4 anode layer
5 anode current collector
6 outer package film
10 battery
11 plate
20 monitoring unit
20a first voltage sensor
20b second voltage sensor
20c third voltage sensor
30 ECU
100 battery system

What is claimed is:

1. A battery system comprising:
a battery including a plurality of laminated cells arranged along a thickness direction and connected in series, and a plate arranged between a pair of the laminated cells,
a first voltage sensor configured to measure a first voltage that is a voltage between a terminal of a reference cell belonging to the plurality of laminated cells, and the plate,
a second voltage sensor configured to measure a second voltage that is a voltage between the terminal of the reference cell and, among the pair of laminated cells that the plate is between, a laminated cell on a reference cell side of the plate, and
an electronic control unit; and
the electronic control unit includes:
a first obtaining unit configured to obtain the first voltage from the first voltage sensor,
a second obtaining unit configured to obtain the second voltage from the second voltage sensor, and
a first determining unit configured to determine an abnormality based on the first voltage and the second voltage.

2. The battery system according to claim 1, wherein
the battery system further comprises a third voltage sensor configured to measure a third voltage that is a voltage between the terminal of the reference cell and, among the pair of laminated cells that the plate is between, a laminated cell on an opposite side of the plate from the reference cell side of the plate, and
the electronic control unit further includes:
a third obtaining unit configured to obtain the third voltage from the third voltage sensor, and
a second determining unit configured to determine an abnormality based on the first voltage and the third voltage when the first determining unit determines an abnormality.

3. A battery system according to claim 1, wherein the battery includes a plurality of plates, and
the electronic control unit is configured to select the plate for measuring the first voltage from the plurality of plates.

4. A battery system comprising:
a battery including a plurality of laminated cells arranged along a thickness direction and connected in series, and a plate arranged between a pair of the laminated cells,
a first voltage sensor configured to measure a first voltage that is a voltage between a terminal of a reference cell belonging to the plurality of laminated cells, and the plate,
a supplemental voltage sensor configured to measure a supplemental voltage that is a voltage between the terminal of the reference cell and, among the pair of laminated cells that the plate is between, a laminated cell on an opposite side from a reference cell side of the plate, and
an electronic control unit; and
the electronic control unit includes:
a first obtaining unit configured to obtain the first voltage from the first voltage sensor,
a supplemental obtaining unit configured to obtain the supplemental voltage from the supplemental voltage sensor, and
a second determining unit configured to determine an abnormality based on the first voltage and the supplemental voltage.

5. A method for determining an abnormality of a battery including a plurality of laminated cells arranged along a thickness direction and connected in series, and a plate arranged between a pair of the laminated cells, the method comprising:
a first voltage measuring step of measuring, by a first voltage sensor, a first voltage that is a voltage between a terminal of a reference cell belonging to the plurality of the laminated cell, and the plate,
a second voltage measuring step of measuring, by a second voltage sensor, a second voltage that is a voltage between the terminal of the reference cell and, among the pair of laminated cells that the plate is between, a laminated cell on a reference cell side of the plate, and
a first determining step of determining, by an electronic control unit, an abnormality based on the first voltage and the second voltage.

6. A method for determining an abnormality of a battery including a plurality of laminated cells arranged along a thickness direction and connected in series, and a plate arranged between a pair of the laminated cells, the method comprising:
a first voltage measuring step of measuring, by a first voltage sensor, a first voltage that is a voltage between a terminal of a reference cell belonging to the plurality of the laminated cell, and the plate,
a supplemental voltage measuring step of measuring, by a supplemental voltage sensor, a supplemental voltage that is a voltage between the terminal of the reference cell and, among the pair of laminated cells that the plate is between, a laminated cell on an opposite side from a reference cell side from the plate, and
a second determining step of determining, by an electronic control unit, an abnormality based on the first voltage and the supplemental voltage.

* * * * *